United States Patent
Gammel et al.

(10) Patent No.: US 9,738,968 B2
(45) Date of Patent: Aug. 22, 2017

(54) APPARATUS AND METHOD FOR CONTROLLING IMPLANT PROCESS

(71) Applicant: Varian Semiconductor Equipment Associates, Inc., Gloucester, MA (US)

(72) Inventors: George M. Gammel, Marblehead, MA (US); Morgan D. Evans, Manchester, MA (US); Stanislav S. Todorov, Topsfield, MA (US); Norman E. Hussey, Middleton, MA (US); Gregory R. Gibilaro, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/131,686

(22) Filed: Apr. 18, 2016

(65) Prior Publication Data

US 2016/0312357 A1   Oct. 27, 2016

Related U.S. Application Data

(60) Provisional application No. 62/151,539, filed on Apr. 23, 2015.

(51) Int. Cl.
    *H01J 37/08*    (2006.01)
    *C23C 14/48*    (2006.01)
    *H01J 37/317*   (2006.01)
    *H01J 37/304*   (2006.01)
    *C23C 14/54*    (2006.01)

(52) U.S. Cl.
    CPC .............. *C23C 14/48* (2013.01); *C23C 14/54* (2013.01); *H01J 37/08* (2013.01); *H01J 37/304* (2013.01); *H01J 37/3171* (2013.01); *H01J 2237/24535* (2013.01); *H01J 2237/24542* (2013.01);
    (Continued)

(58) Field of Classification Search
    None
    See application file for complete search history.

(56) References Cited

U.S. PATENT DOCUMENTS

| 4,922,106 A | 5/1990 | Berrian et al. |
| 5,811,823 A * | 9/1998 | Blake ............... H01J 27/14 250/397 |

(Continued)

OTHER PUBLICATIONS

International Search Report and Written Opinion mailed Jul. 19, 2016, in corresponding international patent application No. PCT/US2016/028198.

*Primary Examiner* — Michael Logie (57) ABSTRACT

An apparatus includes a beam scanner applying, during a non-uniform scanning mode, a plurality of different waveforms generating a scan of an ion beam along a scan direction, wherein a given waveform comprises a plurality of scan segments, wherein a first scan segment comprises a first scan rate and a second scan segment comprises a second scan rate different from the first scan rate; a current detector intercepting the ion beam outside of a substrate region and recording a measured integrated current of the ion beam for a given waveform; and a scan adjustment component coupled to the beam scanner and comprising logic to determine: when a beam width of the ion beam along the scan direction exceeds a threshold; and a plurality of current ratios based on the measured integrated current of the ion beam for at least two different waveforms of the plurality of waveforms.

18 Claims, 4 Drawing Sheets

(52) U.S. Cl.
CPC ............... *H01J 2237/30483* (2013.01); *H01J 2237/31701* (2013.01)

(56) References Cited

U.S. PATENT DOCUMENTS

| | | | |
|---|---|---|---|
| 6,828,204 B2 | 12/2004 | Renau | |
| 7,750,323 B1 | 7/2010 | Wan et al. | |
| 2006/0145096 A1 | 7/2006 | Benveniste et al. | |
| 2008/0067434 A1* | 3/2008 | Walther | H01J 37/3026 250/492.21 |
| 2009/0242808 A1* | 10/2009 | Evans | H01J 37/304 250/492.21 |
| 2012/0244691 A1* | 9/2012 | Ninomiya | C23C 14/48 438/514 |
| 2012/0322248 A1* | 12/2012 | Ninomiya | H01J 37/3171 438/514 |
| 2013/0146760 A1* | 6/2013 | Eisner | H01J 37/244 250/288 |
| 2013/0196492 A1* | 8/2013 | Ninomiya | H01L 21/265 438/527 |
| 2014/0065737 A1* | 3/2014 | Ninomiya | H01J 37/304 438/17 |
| 2014/0326179 A1* | 11/2014 | Todorov | C23C 14/48 118/697 |
| 2016/0189926 A1* | 6/2016 | Ray | H01J 37/304 250/492.21 |

\* cited by examiner

APPARATUS AND METHOD FOR CONTROLLING IMPLANT PROCESS

This application claims priority to U.S. provisional patent application No. 62/151,539, filed Apr. 23, 2015 and incorporated by reference herein in its entirety.

FIELD

The present embodiments relate to processing apparatus and methods, and more particularly, to components and methods to control processing in ion implantation processes.

BACKGROUND

In the present day, various types of processing apparatus are employed to treat or process substrates with ions. For processing substrates such as semiconductor substrates, ions may be used to etch layers or features on a substrate. Ions may also be used to deposit a layer or structures on a substrate, to implant a species into a substrate, or to amorphize a substrate. Techniques have also been developed to monitor processing of a substrate in order to control the processing of a substrate. In the present day, ion implantation tools provide increasing versatility for implantation of a substrate or wafer. While previous development focused on improving the uniformity of wafer processing, many present-day customers of ion implantation apparatus may request various patterns of non-uniform process control for Precision Materials Engineering (PME). In some methods of implantation an ion beam may be provided as a spot beam whose cross-sectional area is smaller than the area of a substrate to be implanted. The spot beam may be scanned along a first direction while the substrate is moved along a second direction, for example, a direction perpendicular to the first direction. In particular methods, non-uniform implantation may be performed by scanning a spot beam according to a predetermined waveform in order to provide variable ion doses to different regions of a substrate.

In order to provide accurate dose control for ion implantation of a substrate using a scanned spot beam, current monitors may be provided at or near a substrate, such as Faraday cup monitors. In some ion implanters, real-time monitoring of a scanned spot beam is performed to estimate ion dose provided to a substrate. A current sensor such as a Faraday cup may be provided adjacent to a substrate to intercept a spot beam scanned back and forth along a first direction while a substrate is scanned in a perpendicular direction. The real-time monitoring may be used to adjust the scanning of a spot beam when the measured ion dose at the current sensor does not match a target ion dose, for example.

In the case of targeted non-uniform ion implantation, a waveform may be applied to the different scans to vary scan rate of the spot beam as the spot beam scans across a substrate. The variation of scan rate across different portions of a substrate has the effect of changing the integrated ion dose implanted into the substrate at different locations along the scan direction. When the variation of scan rate is repeated over multiple spot beam scans as the substrate is moved in a perpendicular direction, a two-dimensional pattern of implantation may be generated where different regions of a substrate receive different ion doses.

A limitation of the aforementioned targeted non-uniform ion implantation lies in the ability to control non-uniform implantation when the spot beam exceeds a certain size. In some cases the size of a spot beam may cause the spot beam to overlap at the same time a current monitor and a substrate region to be implanted. This overlap may limit the ability to apply a targeted waveform to the substrate to generate a targeted non-uniform implantation and at the same time accurately measure ion dose provided to the substrate.

With respect to these and other considerations the present improvements may have been needed.

BRIEF SUMMARY

In one embodiment, an apparatus may include a beam scanner to apply, during a non-uniform scanning mode, a plurality of different waveforms to generate a scan of an ion beam along a scan direction, wherein a given waveform of the plurality of different waveforms comprises a plurality of scan segments, wherein a first scan segment comprises a first scan rate and a second scan segment comprises a second scan rate different from the first scan rate; a current detector disposed to intercept the ion beam outside of a substrate region and configured to record a measured integrated current of the ion beam for a given waveform; and a scan adjustment component coupled to the beam scanner and comprising logic to determine: when a beam width of the ion beam along the scan direction exceeds a threshold; and determine a plurality of current ratios based on the measured integrated current of the ion beam for at least two different waveforms of the plurality of different waveforms when operating in the non-uniform scanning mode.

In another embodiment, an apparatus to control an implant process may include: a beam scanner to apply, during a non-uniform scanning mode, a plurality of different waveforms to generate a scan of an ion beam along a scan direction, wherein a given waveform of the plurality of different waveforms comprises a plurality of scan segments, wherein a first scan segment comprises a first scan rate and a second scan segment comprises a second scan rate different from the first scan rate; a scan adjustment component coupled to the beam scanner; and at least one computer readable medium comprising instructions, where the instructions, when executed, cause the scan adjustment component to: receive a beam width for the ion beam along the scan direction; receive a selection for a scanning mode to apply for the beam scanner; and determine a plurality of current ratios based on a measured integrated current of the ion beam for at least two different waveforms of the plurality of different waveforms when the selection is a non-uniform scanning mode and a threshold is exceeded.

In a further embodiment, an ion implanter, comprising: an ion source to generate an ion beam; a beam scanner to apply, during a non-uniform scanning mode, a plurality of different waveforms to generate a scan of the ion beam along a scan direction, wherein a given waveform of the plurality of different waveforms comprises a plurality of scan segments, wherein a first scan segment comprises a first scan rate and a second scan segment comprises a second scan rate different from the first scan rate; a current detector disposed to intercept the ion beam outside of a substrate region and configured to record a measured integrated current of the ion beam for a given waveform; and a scan adjustment component coupled to the beam scanner and comprising logic to determine: when a beam width of the ion beam along the scan direction exceeds a threshold; and determine a plurality of current ratios based on the measured integrated current of the ion beam for at least two different waveforms of the plurality of different waveforms when operating in the non-uniform scanning mode.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel processing apparatus and methods to generate controlled ion implantation of substrates.

Figure 1:
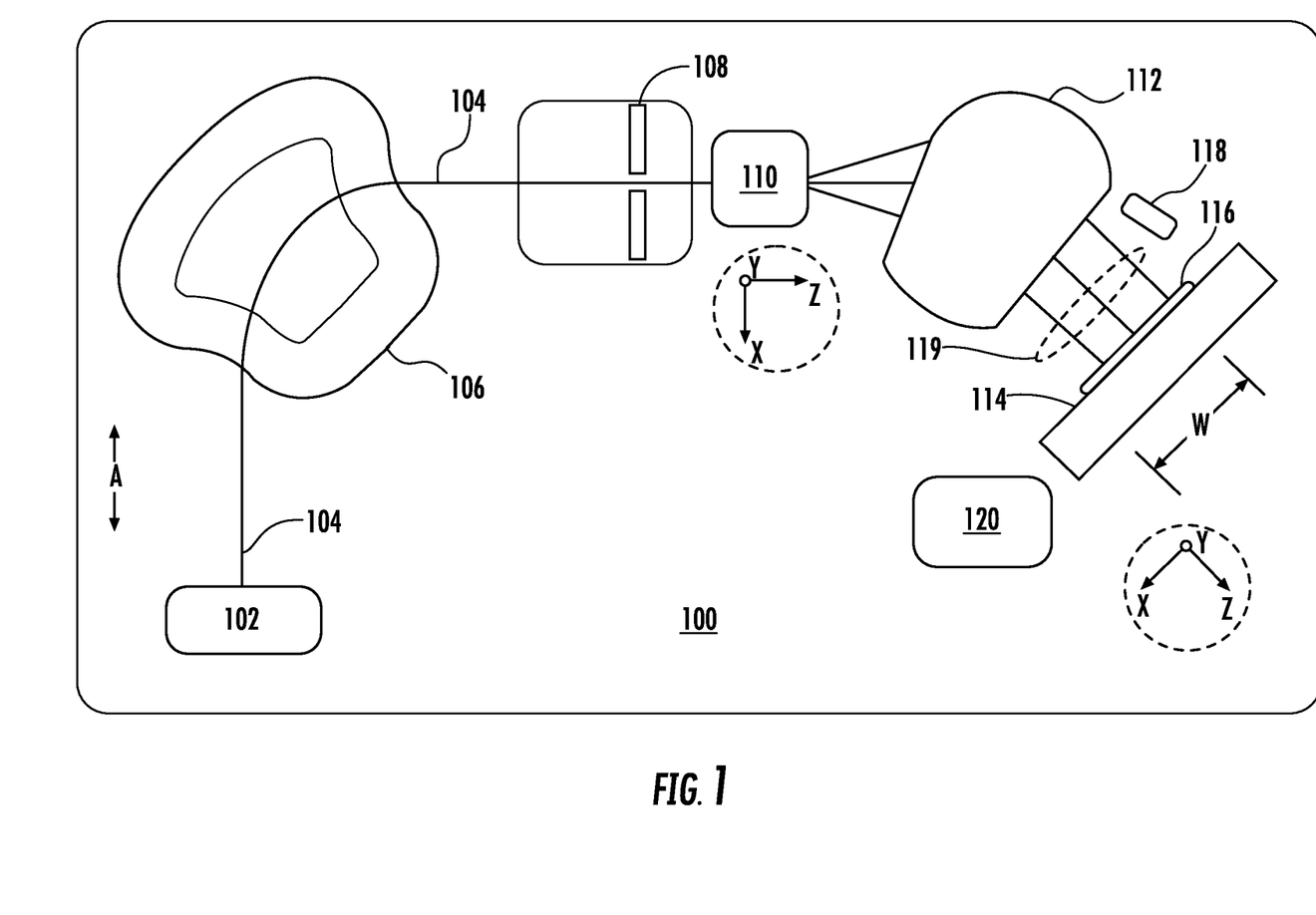
FIG. 1 depicts a top plan view in block form of a beamline ion implanter, in accordance with various embodiments of the disclosure.

FIG. 1 depicts a top plan view in block form of a beamline ion implanter, shown as the ion implanter 100, in accordance with various embodiments of the disclosure. The ion implanter 100 includes an ion source 102 configured to generate an ion beam 104. The ion beam 104 may be provided as a spot beam scanned along a direction, such as the X-direction. In the convention used herein, the Z-direction refers to a direction of an axis parallel to the central ray trajectory of an ion beam 104. Thus, the absolute direction of the Z-direction, as well as the X-direction, where the X-direction is perpendicular to the Z-direction, may vary at different points within the ion implanter 100 as shown. The ion beam 104 may travel through an analyzer magnet 106, mass resolving slit 108, and through a collimator 112 before impacting a substrate 116 disposed on substrate stage 114. The substrate stage 114 may be configured to scan the substrate 116 at least along the Y-direction in some embodiments. In the example shown in FIG. 1, the ion implanter 100 includes a beam scanner 110. When the ion beam 104 is provided as a spot beam, the beam scanner 110 may scan the ion beam 104 along the X-direction, producing a scanned ion beam, also scanned at the substrate along the X-direction. The width of the resulting scanned spot beam may be comparable to the width W of the substrate 116.

In various embodiments, the ion implanter 100 may be configured to deliver ion beams for "low" energy or "medium" energy ion implantation, such as a voltage range of 1 kV to 300 kV, corresponding to an implant energy range of 1 keV to 300 keV for singly charged ions. As discussed below, the scanning of an ion beam provided to the substrate 116 may be adjusted depending upon current measurements being made for a given scanned ion beam.

The ion implanter 100 further includes a current detector 118 such as a closed loop Faraday current detector (CLF), for monitoring beam current provided to the substrate 116. The current detector 118 disposed to intercept the ion beam outside of a substrate region 119 and may be configured to record a measured integrated current of the ion beam 104 during scanning of the ion beam 104.

The ion implanter 100 also includes a scan adjustment component 120. The scan adjustment component 120 may be coupled to the beam scanner 110 as well as current detector 118. The scan adjustment component 120 may adjust scanning of the ion beam 104, particularly in the cases where non-uniform scanning of the ion beam 104 is performed, as detailed below. The scan adjustment component 120 may include logic to generate an adjustment signal for adjusting scanning of the ion beam 104 based upon input such as measured current. In some instances, the logic of scan adjustment component 120 may be implemented in hardware, firmware, or a combination of hardware and software. In some examples the scan adjustment component 120 may include circuitry such as a controller and memory that is coupled to software to execute instructions for adjusting the scanning of ion beam 104. The embodiments are not limited in this context.

In one mode of operation where uniform beam scanning is to be performed, the beam scanner 110 may generate a scanning waveform to provide uniform ion dose over a target area of the substrate 116. In a second mode of operation, the scan adjustment component 120, current detector 118, and beam scanner 110 may be interoperative to adjust the scanning of the ion beam 104 to generate a target non-uniform scanning of the ion beam 104 at the substrate 116.

By way of reference, known ion implanters configured for non-uniform ion implantation may deliver scanned spot beams to a substrate where a waveform is applied to generate a scan signal. The waveform may have multiple scan segments representing different scan rates to be applied to different portions of a substrate. For example, more than a dozen scan segments may be provided for a single scan line. To cover a substrate over a target area with the scanned spot beam, a substrate may be scanned along the Y-direction while a scan waveform is applied to scan the ion beam for a plurality of scans along the X-direction. In some instances multiple different waveforms may be generated to apply multiple different non-uniform scans across a substrate, generating a target pattern of non-uniform ion implantation. To ensure proper ion dose is delivered to a substrate during implantation, a current monitor positioned near the substrate may perform current measurements. In some cases a closed loop Faraday (CLF) monitor may be disposed outside of a substrate position as shown in FIG. 1 and in FIG. 2 below, and may intercept an ion beam and be used to measure integrated current as the ion beam is scanned along the X-direction. The integrated current may be expressed as $\int I(t) \, dt$, where I represents a given current from an ion beam being measured for a given time span. This integrated current may be compared to integrated current measured by a monitor such as a profile current detector, more specifically, a profile Faraday current measurement detector (PF), in order to determine a ratio of integrated CLF current to integrated PF current. The PF detector, may be placed, for example at a position corresponding to the center position of a substrate.

This determined ratio may be employed later to ensure repeatability in providing non-uniform ion dose between different substrates, and for controlling up/down substrate uniformity The aforementioned known method of ensuring accuracy and repeatability for non-uniform ion implantation may work especially well for small spot size beams. However, if the beam width of an ion beam along the scan direction (X-direction) exceeds a certain value dosing errors may be introduced when pattern changes are introduced in a scan while any part of the ion beam remains on the substrate.

The present embodiments provide improvements over known approaches for controlling non-uniform ion implantation by providing techniques to more actively measure a closed loop current such as a CLF current and to adjust scanning of a spot beam accordingly. In various embodiments, the integrated CLF current may be measured for major changes in a waveform pattern, with interpolation or calculation applied for the remaining waveforms. The integrated current from a PF need not be re-measured in this approach. In this manner, a current ratio such as a CLF/PF ratio may be obtained for major changes to a waveform pattern, since CLF is measured at these major changes. Generally, during operation, two current ratios may be determined, three current ratios may be determined, and so forth. These current ratios may include a maximum current ratio, a minimum current ratio or additional current ratio, where a minimum current ratio comprises a minimum ratio of integrated current measured by a closed loop current detector to a reference current, where a maximum current ratio comprises a maximum ratio of integrated current measured by a closed loop current detector to a reference current, at least one additional current ratio, and so forth. For example, this approach may be employed with waveform patterns in a manner generating a minimum CLF/PF ratio, a maximum CLF/PF ratio and an average CLF/PF ratio, in one example, The embodiments are not limited in this context.

Figure 2:
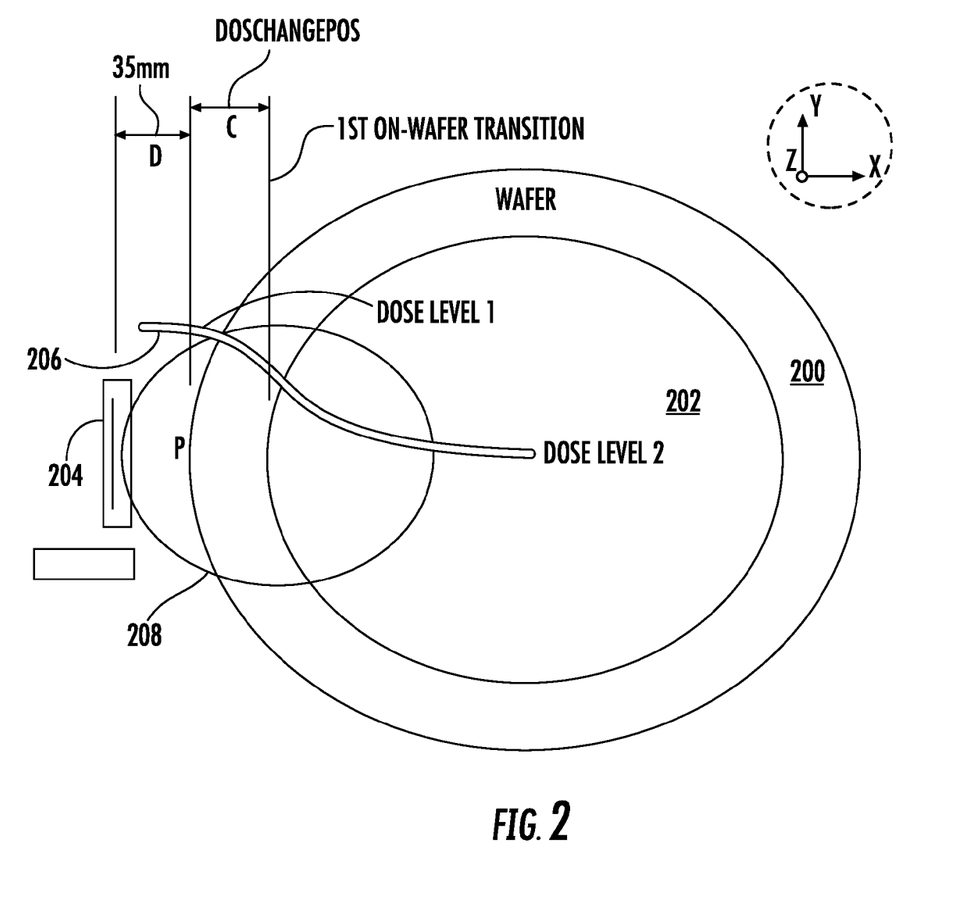
FIG. 2 illustrates general principles of geometry for operating a spot beam in a given mode.

As noted above, in operation an ion implanter such as ion implanter 100 may operate in multiple different modes. In one mode of operation, the ion implanter 100 may operate under the assumption of integrated beam current being the same for all scan lines as the ion beam 104 is swept across substrate 116. FIG. 2 illustrates general principles of geometry for operating in this mode. In this example a substrate 200 is illustrated in plan view from the point of view of an ion beam 208. The ion beam 208 may be scanned along the X-direction to implant a target pattern of ion dose over a target area 202. For non-uniform ion implantation, at least one waveform may be applied to the ion beam 208 having multiple scan segments where the application of different scan segments of the waveform generates different scan speeds, or microslopes. These different scan segments may result in different ion doses being received as a function of position on the substrate 200, since the ion beam 208 may then scan over different segments of the substrate at different speeds while the beam current remains constant. An example of a dose profile is shown by the dose profile 206 where two different dose levels, dose level 1 and dose level 2, are shown as a function of position along the X-axis.

A CLF 204 is provided outside of the substrate 200 to intercept the ion beam 208 when the ion beam 208 is scanned toward the left of the substrate 200 as viewed in FIG. 2. The CLF 204 may measure integrated beam current as the ion beam 208 sweeps from left to right, for example. The CLF 204 may be separated by a minimum distance D when an edge of the substrate 200 at point P is adjacent the CLF 204. For scanning of the substrate 200 along the Y-axis, this minimum point P may represent a point where the center of the substrate 200 and center of the CLF occupy the same Y coordinate. As further shown in FIG. 2, a distance C represents a distance between the edge of the substrate 200 (at point P) and the edge of the target area 202. When the beam size of the ion beam 208 meets the criterion where the half width (HW) of the ion beam 208 along the X-direction is less than D+C, the integrated current seen as ion beam 208 sweeps across the CLF 204 may be correctly assumed to be the same for all scan lines applied to the ion beam 208 as the substrate 200 is scanned, for example, along the Y-direction. In other words, if this criterion is met, the ion beam 208 does not intercept the CLF at the first position where a change within a given waveform is possibly applied, resulting in a change in the sweep speed (micro-slope). In this circumstance the integrated current received by the CLF 204 is the same for all scan lines. In one example, where D is 35 mm, the half width of the ion beam 208 may range up to a value of 35 mm+C (mm) without the ion beam 208 striking the CLF during a change in a waveform. For a value of C of 10 mm, for example, the HW of ion beam 208 may range up to 45 mm.

When the ion beam 208 is wider along the X-direction than twice (D+C), the left edge of the ion beam 208 may still strike the CLF when the sweep rate of the ion beam 208 starts changing. In other words, the beam center of ion beam 208 may be located at a first position where an on-substrate transition in scan speed may occur, while a left portion of the ion beam 208 still strikes the CLF 204. This circumstance is highlighted in more detail below.

Figure 3A:
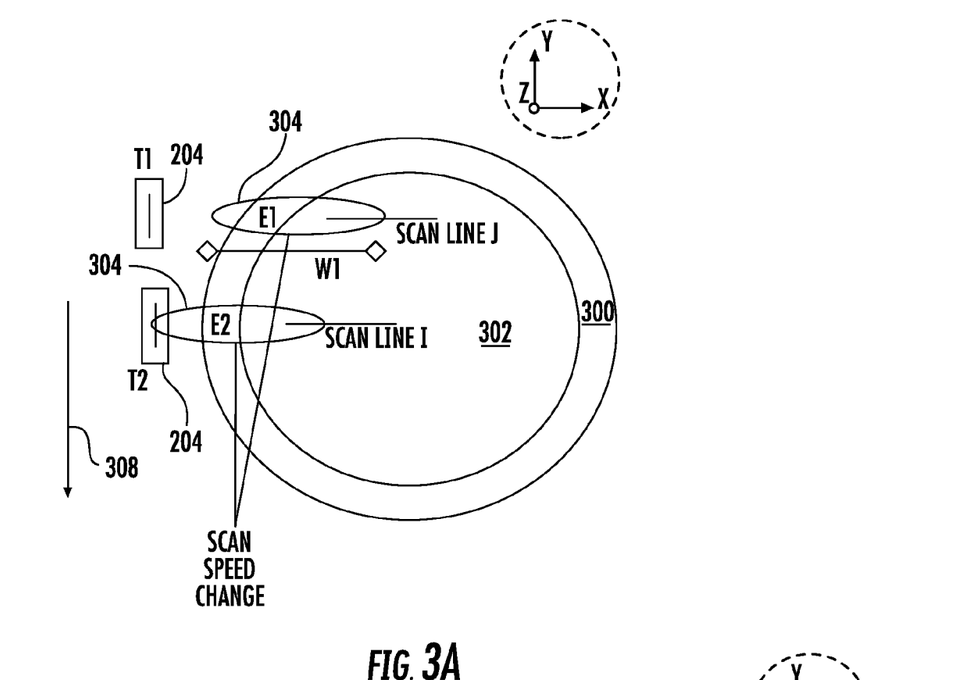
FIG. 3A and FIG. 3B show examples for operation of ion beam scanning in two different modes according to embodiments of the disclosure.
Figure 3B:
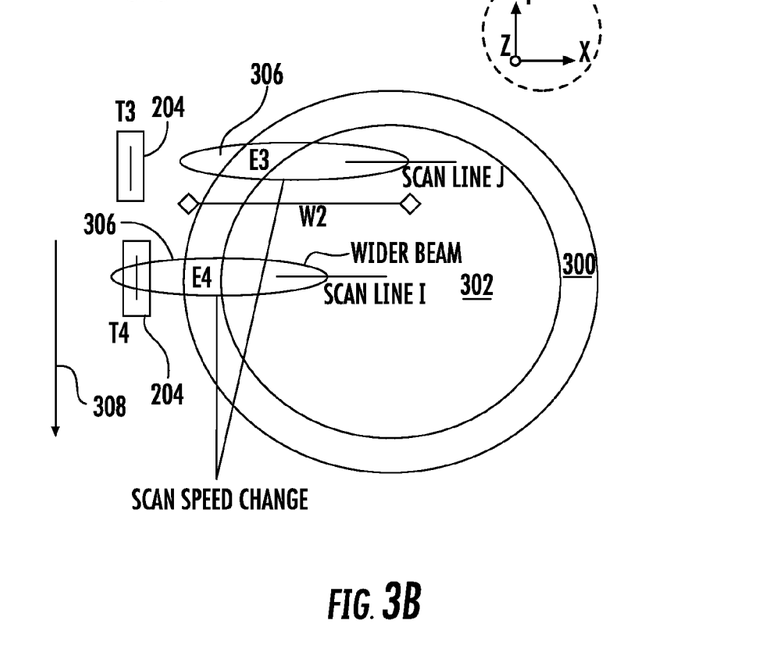

Turning in particular to FIG. 3A and FIG. 3B, there are shown examples for operation of ion beam scanning in two different modes according to embodiments of the disclosure. In FIG. 3A there is shown an example of scanning a substrate 300 along the Y-direction, while an ion beam 304 is scanned along the X-direction. In FIG. 3A there are shown two different instances where the substrate 300 is positioned at two different positions along the Y-direction with respect to the CLF 204. Notably, while the CLF 204 is shown in two different positions with respect to the substrate 300, the CLF 204 may be stationary during the scanning of substrate 300 along the Y-axis. As shown in FIG. 3A at time T1 the ion beam 304 having a width W1 is scanned over a scan line J along the X-direction. At time T1, the relative position of the substrate 300 along the Y-direction with respect to the CLF 204 places the CLF 204 well separated from the edge E1 of the substrate 300. Accordingly, when a waveform applied to the ion beam 304 causes a change of sweep speed as the ion beam 304 begins to scan over the target area 302, the ion beam 304 is not intercepted by a detector slit in the CLF 204. At time T2, the ion beam 304 scans over the scan line I, where the CLF 204 is separated from the edge E2 of the substrate 300 by a lesser distance, a minimum separation between edge of the substrate 300 and CLF 204 as the substrate is scanned along the Y-direction. At the instance depicted in FIG. 3A, the ion beam 304 is deemed to be entering over the target area 302. If a change is sweep speed is induced by a waveform applied over the scan line I at this point, the ion beam 304 also is also no longer intercepted by a detector slit in the CLF 204. Thus, for any scan line of the ion beam 304, any change in sweep speed of the ion beam 304 while the ion beam 304 is positioned over the target area 302 takes place while current from any part of the ion beam 304 is not detected by the CLF 204.

Turning now to FIG. 3B there is shown an example of scanning the substrate 300 along the Y-direction, while an ion beam 306 is scanned along the X-direction. In FIG. 3B there are also shown two different instances where the substrate 300 is positioned at two different positions along the Y-direction with respect to the CLF 204. In this example, the ion beam 306 has a width W2 in the X-direction greater than W1.

At time T3, the relative position of the substrate 300 along the Y-direction with respect to the CLF 204 places the CLF 204 separated from the edge E2 of the substrate 300. Accordingly, when a waveform applied to the ion beam 306 causes a change of sweep speed as the ion beam 304 begins to scan over the target area 302, the beam is fully off CLF 204. At time T4, the ion beam 306 scans over the scan line I, where the CLF 204 is separated from the edge E4 of the substrate 300 by a lesser distance, as noted above. In this circumstance, the combination of greater width of ion beam 306, width W2, and the proximity of the CLF 204 to the edge E4 may result in a scenario as shown in FIG. 3B. In particular, the ion beam 306 is shown at an instance where the ion beam 306 is deemed to be entering the target area 302. At the same time, part of the ion beam 306 is still intercepted by the CLF 204. When a waveform applied over scan line I causes a change in scan speed at this instance or shortly thereafter, by the time the ion beam 306 scans off from the CLF 204, the integrated current detected at the CLF 204 is different than the integrated current detected for scan line J.

In accordance with various embodiments, the scan adjustment component 120 may determine when to apply corrections to adjust for the circumstance where non-uniform implantation is to be applied to a substrate and the beam width of an ion beam exceeds a threshold resulting in the scenario of FIG. 3B, for example. For example, when non-uniform scanning is to be applied, the non-uniform scanning may involve application of many different waveforms, such as at least three different waveforms to scan a spot beam along a scan direction (X-axis) while the substrate is scanned or translated along the Y-axis. For a given ion beam current or current density, the total integrated dose delivered for a given scan line may depend upon overall scan duration for scanning the ion beam over a given scan line, and also depends upon the scan speeds for different scan segments of a scan line. Accordingly, when multiple different waveforms different are to be applied for different scans, ratios may be determined of the total integrated current for the different waveforms to a predetermined reference current. For example, the integrated current for every different waveform may be measured, may be interpolated based upon a few measurements, or may be calculated based upon the micro-slopes, and then normalized with respect to the integrated current for one of the waveforms. In this way, an array of normalized integrated currents may be created, one for every different waveform. The array may then be used as a series of multipliers or macroscan factors to be applied for the measured integrated currents for every different waveform.

Figure 4:
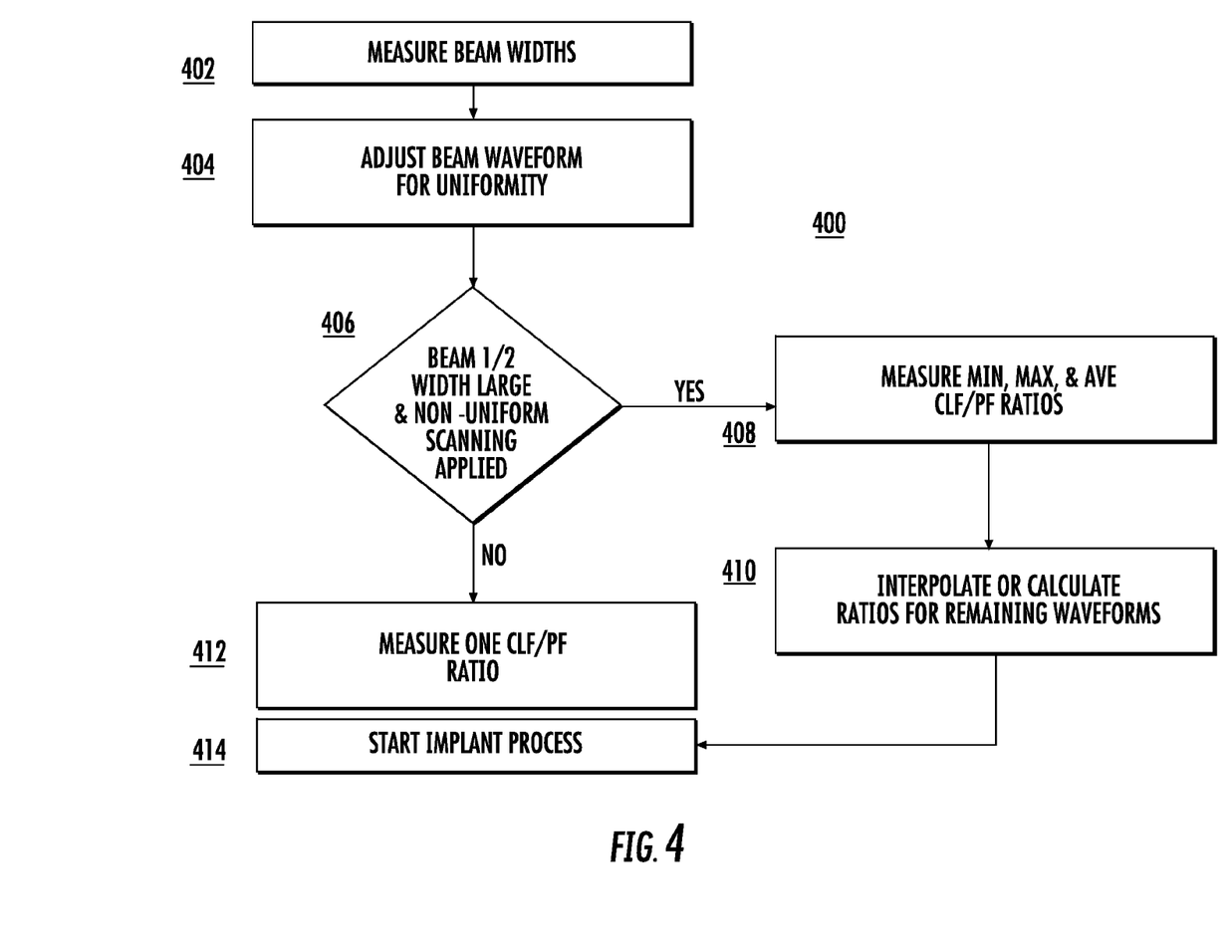
FIG. 4 depicts an exemplary process flow.

FIG. 4 depicts an exemplary process flow 400 according to further embodiments of the disclosure. In some embodiments, at least one of the operations of the exemplary process flow 400 may be implemented by the scan adjustment component 120. At block 402 beam width of an ion beam may be measured. Beam width may be measured, for example by a detector. At block 404 a waveform applied to the ion beam may be adjusted for uniformity. At decision block 406 a determination is made if the half-width of the ion beam is large. In this context "Large" may mean a circumstance when the half width (HW) of the ion beam along a scan path or scan direction exceeds a threshold and is sufficiently large to cause an overlap of the ion beam with a closed loop current detector while the ion beam center is over a target area of the substrate as depicted at time T4 in FIG. 3B, for example. In other words, the ion beam may be deemed large if HW is equal to or exceeds the quantity (D+C) as defined above. At decision block 406 a further determination is made as to whether non-uniform beam scanning is to be applied to the ion beam, such as the scanning procedures described above.

If either non-uniform scanning is not to be applied, or if the ion beam is not large, or both, the flow proceeds to block 412. At block 412 one ratio of integrated current at a detector such as a CLF to integrated current measured at a PF or similar detector is determined. The flow then proceeds to block 414 where an implant process is started. In this circumstance the implant process may involve a uniform scanning mode or alternatively a non-uninform scanning mode where the ion beam is not deemed to be large. If non-uniform scanning is to be applied to expose a substrate and the ion beam is deemed to be large, the flow proceeds to block 408 where minimum CLF/PF ratio, maximum CLF/PF ratio, and average CLF/PF ratios may be measured for different waveforms of a recipe to generate the non-uniform scanning. For example the minimum CLF/PF ratio may be determined from a waveform generating the minimum integrated current, and so forth. These measurements may be performed by measuring integrated current detected at a CLF for major changes in a waveform. In different embodiments, to obtain a given ratio, the different integrated current measured at the CLF may be compared to a pre-measured integrated current or reference integrated current such as determined by a PF. The flow then proceeds to block 410. At block 410, interpolation or calculation of the ratios may be performed for the remaining waveforms of the recipe. For example, while just a few integrated current measurements may be performed for selected waveforms, these current measurements may be used to generate many other ratios as needed for many other waveforms of a recipe. The flow then proceeds to block 414.

In accordance with the process flow 400 the expected dose of a given scan line of an ion beam scanned over a substrate may be scaled using CLF/PF measurements. In one example, when any given scan line using a given waveform is to be applied to an ion beam to scan over a substrate, a "macroscan factor" or multiplier may be applied to the waveform to account for the measured integrated current CLF. Thus, for a given waveform constructed from multiple scan segments, the actual set of scan speeds applied to the ion beam as the ion beam scans over a substrate may be generated by applying a multiplier, or macroscan factor determined from the CLF measurements. For example, the scan adjustment component 120 may send an adjustment signal to the beam scanner 110 to apply a given macroscan factor to the waveform for the given scan line. This may result in increasing or decreasing the overall duration for scanning an ion beam over the given scan line, without changing relative scan speeds between different scan segments.

In various embodiments, a first waveform of a set of waveforms to be applied for scanning an ion beam may be used as a reference waveform. An integrated current may be measured by a detector as the beam is scanned using the reference waveform and may be stored as a reference integrated current. When ion implantation of a substrate is to commence the actual integrated current for a given waveform at a given scan line may be measured as the ion beam is scanned over the detector. A ratio of the reference integrated current to the actual integrated current may be used as a method to determine the macroscan factor. In one example, the macroscan factor may simply constitute the ratio of the reference integrated current to actual integrated current measured at time of implantation.

An advantage afforded by the present embodiments includes the ability to apply non-uniform implantation processing to substrates when a beam width of an ion beam is large and overlaps a detector such as a CLF while the ion beam is processing a target area of the substrate. Another advantage is the ability to perform non-uniform processing while not having to rotate a substrate regardless of the beam width of the ion beam.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus, comprising:
 a beam scanner to apply, during a non-uniform scanning mode, a plurality of different waveforms to generate a scan of an ion beam along a scan direction, wherein a given waveform of the plurality of different waveforms comprises a plurality of scan segments, wherein a first scan segment comprises a first scan rate and a second scan segment comprises a second scan rate different from the first scan rate;
 a current detector disposed to intercept the ion beam outside of a substrate region and configured to record a measured integrated current of the ion beam for a given waveform; and
 a scan adjustment component coupled to the beam scanner and comprising logic to determine when a beam width of the ion beam along the scan direction exceeds a threshold; and determine a plurality of current ratios based on the measured integrated current of the ion beam for at least two different waveforms of the plurality of different waveforms when operating in the non-uniform scanning mode.

2. The apparatus of claim 1, further comprising a substrate stage to hold a substrate in the substrate region, wherein the threshold is given by HW=D+C, where HW equals a half-width of the ion beam along the scan direction of the ion beam, D equals a minimum distance between an edge of the substrate and the current detector during scanning of the substrate, and C represents a distance between the edge of the substrate and an edge of a target area to be processed by the ion beam, when the edge of the substrate is positioned at the minimum distance from the current detector.

3. The apparatus of claim 1, the logic to generate an adjustment signal for adjusting a macroscan factor for at least one waveform of the plurality of different waveforms, wherein the adjusting the macroscan factor comprises an adjustment of overall duration for scanning the ion beam over a given scan line, without changing relative scan speeds between the first scan segment and second scan segment.

4. The apparatus of claim 1, further comprising a profile Faraday current measurement detector disposed to intercept the ion beam over the substrate position, wherein a given current ratio of the plurality of current ratios comprises a ratio of the measured integrated current of the ion beam for the given waveform to a reference current measured by the profile Faraday current measurement detector.

5. The apparatus of claim 1, wherein a given current ratio of the plurality of current ratios comprises a ratio of the measured integrated current of the ion beam for the given waveform to a predetermined reference current.

6. The apparatus of claim 1, wherein the plurality of different waveforms comprises at least three different waveforms, wherein the plurality of current ratios includes at least three current ratios, the logic to determine at least two current ratios based on the measured integrated current of the ion beam for the at least two different waveforms.

7. The apparatus of claim 6, the logic to determine remaining current ratios based upon interpolation from the at least two current ratios or calculation based upon the at least two current ratios.

8. The apparatus of claim 1, wherein the current detector comprises a closed loop current detector, the logic of the scan adjustment component to determine at least one additional current ratio for at least one additional waveform of the plurality of different waveforms based upon a minimum current ratio and a maximum current ratio, the minimum current ratio comprising a minimum ratio of integrated current measured by the closed loop current detector to a reference current, and the maximum current ratio comprising a maximum ratio of integrated current measured by the closed loop current detector to the reference current.

9. An apparatus to control an implant process, comprising:
 a beam scanner to apply, during a non-uniform scanning mode, a plurality of different waveforms to generate a scan of an ion beam along a scan direction, wherein a given waveform of the plurality of different waveforms comprises a plurality of scan segments, wherein a first scan segment comprises a first scan rate and a second scan segment comprises a second scan rate different from the first scan rate;
 a scan adjustment component coupled to the beam scanner; and
 at least one computer readable medium comprising instructions, where the instructions, when executed, cause the scan adjustment component to:
  receive a beam width for the ion beam along the scan direction;
  receive a selection for a scanning mode to apply for the beam scanner; and
  determine a plurality of current ratios based on a measured integrated current of the ion beam for at least two different waveforms of the plurality of different waveforms when the selection is a non-uniform scanning mode and a threshold is exceeded.

10. The apparatus of claim 9, the at least one computer readable medium comprising instructions, where the instructions, when executed, cause the scan adjustment component to determine when the threshold is exceeded, wherein the threshold is given by HW=D+C, where HW equals a half-width of the ion beam along the scan direction of the ion beam, D equals a minimum distance between an edge of the substrate and the current detector during scanning of the substrate, and C represents a distance between the edge of the substrate and an edge of a target area to be processed by the ion beam, when the edge of the substrate is positioned at the minimum distance from the current detector.

11. The apparatus of claim 9, the at least one computer readable medium comprising instructions, where the instructions, when executed, cause the scan adjustment component to generate an adjustment signal for adjusting a macroscan factor for at least one waveform of the plurality of different waveforms, wherein the adjusting the macroscan factor comprises an adjustment of overall duration for scanning the ion beam over a given scan line, without changing relative scan speeds between the first scan segment and second scan segment.

12. The apparatus of claim 11, the at least one computer readable medium comprising instructions, where the instructions, when executed, cause the scan adjustment component to: send a signal to begin an implantation process after generation of the adjustment signal.

13. The apparatus of claim 9, wherein the plurality of different waveforms comprises at least three different waveforms, wherein the plurality of current ratios includes at least three current ratios, the at least one computer readable medium comprising instructions, where the instructions, when executed, cause the scan adjustment component to determine at least two current ratios based on a measured integrated current of the ion beam for the at least two different waveforms.

14. The apparatus of claim 13, the at least one computer readable medium comprising instructions, where the instructions, when executed, cause the scan adjustment component to determine remaining current ratios based upon interpolation from the at least two current ratios or calculation based upon the at least two current ratios.

15. The apparatus of claim 9, further comprising a closed loop current detector for detecting the measured integrated current of the ion beam for the at least two different waveforms, the at least one computer readable medium comprising instructions, where the instructions, when executed, cause the scan adjustment component to:
receive a minimum current ratio comprising a minimum ratio of integrated current measured by the closed loop current detector to a reference current;
receive a maximum current ratio comprising a maximum ratio of integrated current measured by the closed loop current detector to the reference current; and
determine at least one additional current ratio for at least one additional waveform of the plurality of different waveforms based upon the minimum current ratio and the maximum current ratio.

16. The apparatus of claim 15, the at least one computer readable medium comprising instructions, where the instructions, when executed, cause the scan adjustment component to: determine the at least one additional current ratio based upon interpolation from the maximum current ratio and minimum current ratio or using a calculation from the maximum current ratio and minimum current ratio.

17. An ion implanter, comprising:
an ion source to generate an ion beam;
a beam scanner to apply, during a non-uniform scanning mode, a plurality of different waveforms to generate a scan of the ion beam along a scan direction, wherein a given waveform of the plurality of different waveforms comprises a plurality of scan segments, wherein a first scan segment comprises a first scan rate and a second scan segment comprises a second scan rate different from the first scan rate;
a current detector disposed to intercept the ion beam outside of a substrate region and configured to record a measured integrated current of the ion beam for a given waveform; and
a scan adjustment component coupled to the beam scanner and comprising logic to determine:
when a beam width of the ion beam along the scan direction exceeds a threshold; and
determine a plurality of current ratios based on the measured integrated current of the ion beam for at least two different waveforms of the plurality of different waveforms when operating in the non-uniform scanning mode.

18. The ion implanter of claim 17, the current detector comprising a closed loop Faraday current detector (CLF), the apparatus further comprising:
a substrate scanner to scan a substrate in a direction perpendicular to the scan direction; and
a profile current detector (PF) disposed in a center position with respect to the substrate, the PF to collect a reference current, wherein the plurality of current ratios are determined from a ratio or current detected by the CLF to reference current for the plurality of different waveforms.

* * * * *